US009123777B2

(12) United States Patent
Choi et al.

(10) Patent No.: US 9,123,777 B2
(45) Date of Patent: Sep. 1, 2015

(54) METHOD FOR FABRICATING MICRO ELECTRO DEVICE, METHOD FOR FABRICATING ORGANIC LIGHT EMITTING DISPLAY DEVICE, MICRO ELECTRO DEVICE AND ORGANIC LIGHT EMITTING DISPLAY DEVICE FABRICATED THEREBY

(71) Applicant: SAMSUNG DISPLAY CO., LTD., Yongin, Gyeonggi-Do (KR)

(72) Inventors: Dan Bi Choi, Yongin (KR); Jung Hun Lee, Yongin (KR); Sun Ho Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 57 days.

(21) Appl. No.: 14/017,345

(22) Filed: Sep. 4, 2013

(65) Prior Publication Data
US 2014/0231762 A1 Aug. 21, 2014

(30) Foreign Application Priority Data

Feb. 19, 2013 (KR) ........................ 10-2013-0017567

(51) Int. Cl.
*H01L 21/00* (2006.01)
*H01L 21/768* (2006.01)
*H01L 21/3105* (2006.01)
*H01L 21/311* (2006.01)

(52) U.S. Cl.
CPC ......... *H01L 21/76805* (2013.01); *H01L 21/311* (2013.01); *H01L 21/3105* (2013.01); *H01L 21/31127* (2013.01)

(58) Field of Classification Search
CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC ............... 438/22–47, 69, 493, 503, 507, 956; 257/E51.018–E51.022, E33.054, 257/E25.028, E25.032, E31.058, E31.063, 257/E31.115, E27.133–E27.139
See application file for complete search history.

(56) References Cited

U.S. PATENT DOCUMENTS

2012/0153502 A1* 6/2012 Price et al. .................... 257/774

FOREIGN PATENT DOCUMENTS

| JP | 2006-281483 A | 10/2006 |
| KR | 10-2011-0040090 A | 4/2011 |
| KR | 10-2011-0047769 A | 5/2011 |
| KR | 10-2011-0065206 A | 6/2011 |

* cited by examiner

*Primary Examiner* — Selim Ahmed
*Assistant Examiner* — Moin Rahman
(74) *Attorney, Agent, or Firm* — Lee & Morse, P.C.

(57) ABSTRACT

A method for fabricating a micro electro device includes forming a conductive pattern on a substrate, forming an organic insulating film on a whole surface of the substrate with an organic insulating material to cover the conductive pattern, preparing a printing plate coated with an insulating film removing material, and forming a contact hole by removing a first portion of the organic insulating film through making the insulating film removing material come in contact with the first portion of the organic insulating film that corresponds to the conductive pattern, and forming a contact in the contact hole.

21 Claims, 15 Drawing Sheets

METHOD FOR FABRICATING MICRO ELECTRO DEVICE, METHOD FOR FABRICATING ORGANIC LIGHT EMITTING DISPLAY DEVICE, MICRO ELECTRO DEVICE AND ORGANIC LIGHT EMITTING DISPLAY DEVICE FABRICATED THEREBY

CROSS-REFERENCE TO RELATED APPLICATIONS

This application claims the benefit of and priority under 35 U.S.C. §119 to Korean Patent Application No. 10-2013-0017567, filed on Feb. 19, 2013, in the Korean Intellectual Property Office, and entitled: "METHOD FOR FABRICATING MICRO ELECTRO DEVICE, METHOD FOR FABRICATING ORGANIC LIGHT EMITTING DISPLAY DEVICE, MICRO ELECTRO DEVICE AND ORGANIC LIGHT EMITTING DISPLAY DEVICE FABRICATED THEREBY," which is incorporated by reference herein in its entirety.

BACKGROUND

1. Field

Embodiments relate to a method for fabricating a micro electro device, a method for fabricating an organic light emitting display device, and a micro electro device and an organic light emitting display device fabricated thereby.

2. Description of the Related Art

A micro electro device is a micro-sized device using conduction of electrons in a solid, and is a device that operates through electrical connection between one conductive pattern and the other conductive pattern. Examples of micro electro devices may be a thin film transistor (TFT), a diode, and the like.

Such a thin film transistor is used as a switching device for controlling the operation of each pixel or a driving device for driving each pixel in a flat display device, such as a liquid crystal display, an organic light emitting display device, and the like.

SUMMARY

Embodiments are directed to a method for fabricating a micro electro device, the method including forming a conductive pattern on a substrate, forming an organic insulating film on a whole surface of the substrate with an organic insulating material to cover the conductive pattern, preparing a printing plate coated with an insulating film removing material, and forming a contact hole by removing a first portion of the organic insulating film through making the insulating film removing material come in contact with the first portion of the organic insulating film that corresponds to the conductive pattern, and forming a contact in the contact hole.

The conductive pattern may be formed of a first conductive material.

The organic insulating film may be formed of at least one of polystyrene, polyvinylalcohol, polyvinylphenol, and polymethylmethacrylate using a coating or printing method.

The insulating film removing material may be a material having higher surface energy than the organic insulating film, or a solvent that dissolves the organic insulating film.

The printing plate may include a rotary body and a plurality of projections on an outer surface of the body, and the insulating film removing material may be coated on the projections and may be a material that has higher surface energy than the organic insulating film, and the forming the contact hole may include making the insulating film removing material come in contact with the first portion of the organic insulating film, making the insulating film removing material come in close contact with the first portion of the organic insulating film while rotating the body through application of pressure to the printing plate, and separating the first portion of the organic insulating film from the conductive pattern in a state where the first portion of the organic insulating film is in close contact with the insulating film removing material.

The insulating film removing material may be selected from an organic polymer, silicon oxide, and silicon nitride.

The printing plate may include a rotary body and a plurality of projections on an outer surface of the body, and the insulating film removing material may be coated on the projections and is a solvent that dissolves the organic insulating film, and the forming of the contact hole may include dissolving the first portion of the organic insulating film by the insulating film removing material where the insulating film removing material comes in contact with the first portion of the organic insulating film.

The insulating film removing material may be selected from toluene, ethyl alcohol, and propylene glycol monomethyl ether acetate.

The printing plate may include a first printing plate having a first rotary body and a plurality of first projections on an outer surface of the first body, and a second printing plate having a second rotary body and a plurality of second projections on an outer surface of the second body, the insulating film removing material may include a first insulating film removing material coated on the first projections and having higher surface energy than the organic insulating film, and a second insulating film removing material coated on the second projections and dissolving the organic insulating film, and the forming of the contact hole may include dissolving the first portion of the organic insulating film by the second insulating film removing material through making the second insulating film removing material come in contact with the first portion of the organic insulating film, making the first insulating film removing material come in contact with a second portion of the organic insulating film where the second portion of the organic insulating film remains on the conductive pattern, making the first insulating film removing material come in close contact with the second portion of the organic insulating film while rotating the first body through application of pressure to the first printing plate, and separating the second portion of the organic insulating film from the conductive pattern in a state where the second portion of the organic insulating film is in close contact with the first insulating film removing material.

Embodiments are also directed to a micro electro device, including a substrate, a conductive pattern on an upper portion of the substrate, an organic insulating film on the upper portion of the substrate to cover an edge of the conductive pattern, a contact hole in a region, which corresponds to the conductive pattern, of the organic insulating film to expose the conductive pattern from the organic insulating film, and having an uneven inner wall, and a contact in the contact hole.

Embodiments are also directed to a method for fabricating an organic light emitting display device, the method including forming an active layer on a substrate, the active layer including a channel region and a source region and a drain region on respective sides of the channel region, forming an organic gate insulating film on a whole surface of the substrate to cover the active layer, forming a gate electrode on a region, which corresponds to the channel region, of an upper portion of the organic gate insulating film, and forming an interlayer insulating film on a whole surface of the organic gate insulating film to cover the gate electrode, preparing a printing plate coated with an insulating film removing material, and forming a first contact hole and a second contact hole by removing each of a first portion and a second portion of an organic gate electrode and the interlayer insulating film corresponding to each of the source region and the drain region through making the insulating film removing material come in contact with each of the first portion and the second portion of the organic gate electrode and the interlayer insulating film, and forming a source electrode in the first contact hole and forming a drain electrode in the second contact hole.

The channel region may be a center region of the active layer that is formed of a semiconductor material, and the source region and the drain region may be formed by injecting ions onto the semiconductor material.

The channel region may be formed of an organic semiconductor material using a coating or printing method, and the source region and the drain region may be formed of an organic conductive material using the coating or printing method.

The organic gate insulating film and the interlayer insulating film may be formed of at least one of polystyrene, polyvinylalcohol, polyvinylphenol, and polymethylmethacrylate using a coating or printing method.

The gate electrode may be formed of an organic conductive material using a printing method.

The insulating film removing material may be a material having higher surface energy than each of the organic gate insulating film and the interlayer insulating film, or may be a solvent that dissolves the organic gate insulating film and the interlayer insulating film.

The printing plate may include a rotary body and a plurality of projections on an outer surface of the body, and the insulating film removing material may be a material that is coated on the projections and has higher surface energy than each of the organic gate insulating film and the interlayer insulating film, and the forming of the contact holes may include making the insulating film removing material come in contact with each of the first portion and the second portion of the organic gate electrode and the interlayer insulating film, making the insulating film removing material come in close contact with each of the first portion and the second portion of the organic gate electrode and the interlayer insulating film while rotating the body through application of pressure to the printing plate, and separating the first portion and the second portion of the organic gate electrode and the interlayer insulating film from the source region and the drain region in a state where each of the first portion and the second portion of the organic gate electrode and the interlayer insulating film is in close contact with the insulating film removing material.

The insulating film removing material may be selected from an organic polymer, silicon oxide, and silicon nitride.

The printing plate may include a rotary body and a plurality of projections on an outer surface of the body, and the insulating film removing material may be coated on the projections and may be a solvent that dissolves the interlayer insulating film and the organic gate insulating film, and the forming of the contact holes may include dissolving each of the first portion and the second portion of the organic gate electrode and the interlayer insulating film by the insulating film removing material where the insulating film removing material comes in contact with each of the first portion and the second portion of the organic gate electrode and the interlayer insulating film.

The insulating film removing material may be selected from toluene, ethyl alcohol, and propylene glycol monomethyl ether acetate.

The printing plate may include a first printing plate having a first rotary body and a plurality of first projections on an outer surface of the first body, and a second printing plate having a second rotary body and a plurality of second projections on an outer surface of the second body, the insulating film removing material may include a first insulating film removing material coated on the first projections and having higher surface energy than each of the interlayer insulating film and the organic gate insulating film, and a second insulating film removing material coated on the second projections and dissolving the interlayer insulating film and the organic gate insulating film, and the forming of the contact holes may include dissolving each of the first portion and the second portion of the organic gate electrode and the interlayer insulating film by the second insulating film removing material through making the second insulating film removing material come in contact with each of the first portion and the second portion of the organic gate electrode and the interlayer insulating film, making the first insulating film removing material come in contact with each of a third portion and a fourth portion of the organic gate electrode and the interlayer insulating film where the third portion and the fourth portion of the organic gate electrode and the interlayer insulating film remain on each of the source region and the drain region, making the first insulating film removing material come in close contact with each of the third portion and the fourth portion of the organic gate electrode and the interlayer insulating film while rotating the first body through application of pressure to the first printing plate, and separating each of the third portion and the fourth portion of the organic gate electrode and the interlayer insulating film from each of the source region and the drain region in a state where each of the third portion and the fourth portion of the organic gate electrode and the interlayer insulating film are in close contact with the first insulating film removing material.

The source electrode and the drain electrode may be formed of an organic conductive material using an inkjet printing method.

Embodiments are also directed to an organic light emitting display device, including a substrate, an active layer including a channel region on an upper portion of the substrate and a source region and a drain region on respective sides of the channel region, an organic gate insulating film on the upper portion of the substrate to cover the active layer, a gate electrode on a region, which corresponds to the channel region, of an upper portion of the organic gate insulating film, an interlayer insulating film on an upper portion of the organic gate insulating film to cover the gate electrode, a first contact hole and a second contact hole in regions corresponding each of the source region and the drain region of the organic gate insulating film and the interlayer insulating film to expose each of the source region and the drain region from the organic gate insulating film and the interlayer insulating film, and having uneven inner walls, and a source electrode in the first contact hole and a drain electrode in the second contact hole.

BRIEF DESCRIPTION OF THE DRAWINGS

Features will become apparent to those of skill in the art by describing in detail example embodiments with reference to the attached drawings in which.

DETAILED DESCRIPTION

Figure 1:
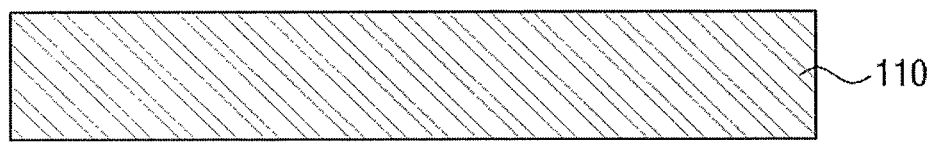
FIGS. 1 to 7 are cross-sectional views showing processing steps of a method for fabricating a micro electro device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. Like reference numerals refer to like elements throughout.

It will be understood that when a layer is referred to as being "on" another layer or substrate, it may be directly on the other layer or substrate, or intervening layers may also be present. It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the disclosure.

Hereinafter, example embodiments will be described with reference to the accompanying drawings.

FIGS. 1 to 7 are cross-sectional views showing processing steps of a method for fabricating a micro electro device according to an example embodiment.

In the present example embodiment, first, referring to FIG. 1, a substrate 110 is prepared. The substrate 110 may be an insulating substrate, such as glass, quartz, sapphire, or plastic, or a semiconductor substrate.

Figure 2:
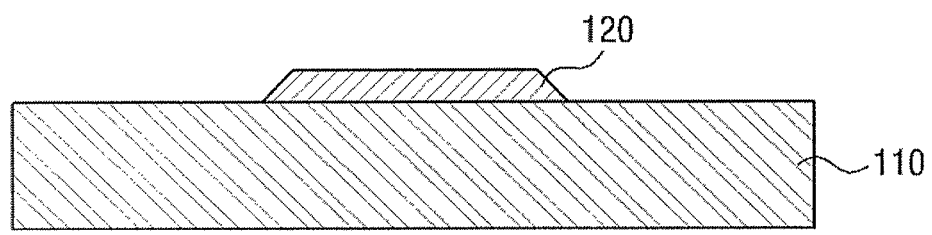

Referring to FIG. 2, a conductive pattern 120 is formed on the substrate 110. The conductive pattern 120 may be formed of a first conductive material, for example, an organic conductive material, an inorganic conductive material, or a metal material.

As the organic conductive material, polythiophene, polyaniline, polyacetylene, polypyrrole, polyphenylene vinylene, polyethylenedioxythiophene (PEDOT): polystyrenesulfonate (PSS), and the like may be selected. As the inorganic conductive material, indium tin oxide (ITO), indium zinc oxide (IZO), and the like may be selected. As the metal material, gold (Au), silver (Au), aluminum (Al), nickel (Ni), molybdenum (Mo), tungsten (W), and the like may be selected.

The conductive pattern 120 may be formed by depositing the first conductive material on the whole surface of the substrate 110 using chemical vapor deposition (CVD), physical vapor deposition (PVD), and the like, and patterning the deposited material through a photolithographic process. Further, the conductive pattern 120 may be formed by directly printing the substrate 110 in an inkjet printing method, a gravure printing method, and the like. In this case, the above-described photolithographic process may be omitted.

Although not illustrated, a buffer layer may be formed on the substrate 110 before the conductive pattern 120 is formed. The buffer layer serves to prevent permeation of impure elements and to perform planarization of the surface of the substrate 110, and may be formed of various materials that may perform such functions. However, the buffer layer is not necessarily used, and may be omitted depending on the kind and processing condition of the substrate 110.

Figure 3:
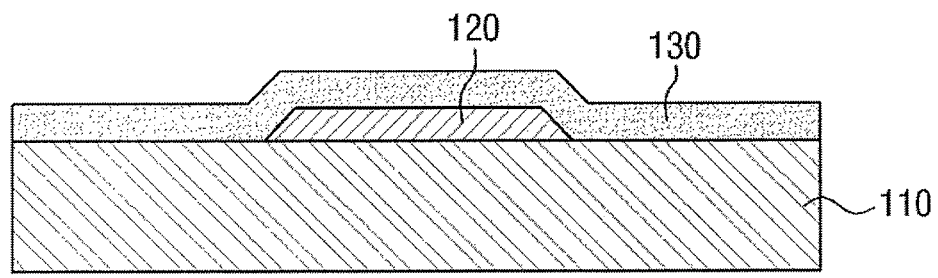

Referring to FIG. 3, an organic insulating film 130 is formed on the whole surface of the substrate 110 to cover the conductive pattern 120. The organic insulating film 130 may be formed of an organic insulating material, for example, may be formed of at least one of polystyrene, polyvinylalcohol, polyvinylphenol, and polymethylmethacrylate.

The organic insulating film 130 may be formed using methods of spin coating, roll-to-roll printing, screen printing, inkjet printing, and the like. As the roll-to-roll printing method, gravure printing, offset printing, flexographic printing, and the like may be used.

The organic insulating film 130 may be formed of an organic insulating material so that the coating or printing method may be used. Thus, the size of the substrate 110 may not be limited thereby, and the fabricating time may not be lengthened. Accordingly, limitations on the size of the substrate that may be used may be reduced or avoided. Further, limitations associated with an inorganic insulating material may be reduced or avoided. For example, it may take a long time to release the vacuum state after the formation of the insulating film is completed in the case where the insulating film is formed of the inorganic insulating material when a vacuum deposition method using vacuum deposition equipment is used.

Figure 4:
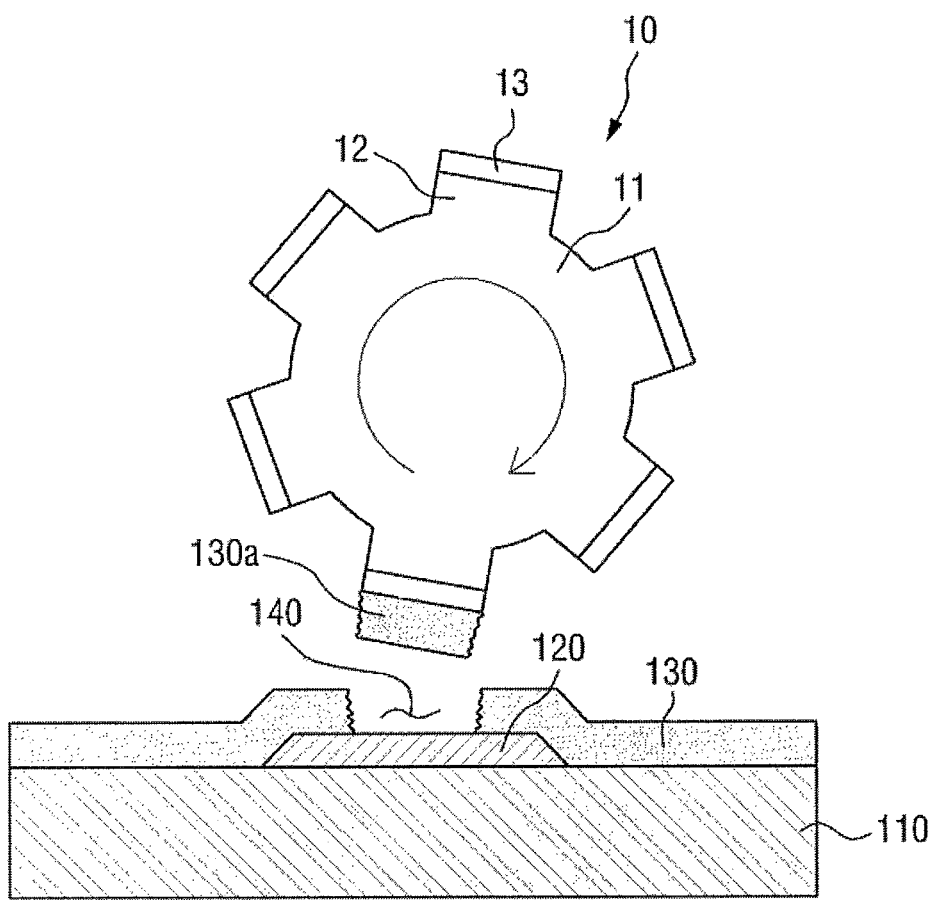

Referring to FIG. 4, a printing plate 10 coated with an insulating film removing material 13 is prepared, and a contact hole 140 is formed by removing a first portion 130*a* of the organic insulating film 130, which corresponds to the conductive pattern 120, through making the insulating film removing material 13 come in contact with the first portion 130*a*. FIG. 4 illustrates a state where the first portion 130*a* of the organic insulating film 130 that corresponds to the conductive pattern 120 has been transferred to the printing plate 10 by the insulating film removing material 13.

In an example embodiment, the printing plate 10 including a rotary body 11 and a plurality of projections 12 formed on an outer surface of the body is prepared, and the insulating film removing material 12 is coated on the projections 12. The body 11 may be in a roll shape, and the width of the projection 12 may be the same as the width of the first portion 130*a* of the organic insulating film 130. The insulating film removing material 13 may be made of a material having higher surface energy than the organic insulating film 130. For example, the insulating film removing material 130 may be selected from an organic polymer, silicon oxide, and silicon nitride.

The insulating film removing material 13 is made to come in contact with the first portion 130*a* of the organic insulating film 130 using the printing plate 10, the insulating film removing material 13 is made to come in close contact with the first portion 130*a* of the organic insulating film 130 while the body 11 is rotated through application of pressure to the printing plate 10, and the first portion 130*a* of the organic insulating film 130 is separated from the conductive pattern 120 in a state where the first portion 130a of the organic insulating film 130 is in close contact with the insulating film removing material 13. Accordingly, the contact hole 140 may be formed. The first portion 130a of the organic insulating film 130 may be separated from the conductive pattern 120 because the surface energy of the organic insulating film 130 is lower than the surface energy of the insulating film removing material and the separation of the first portion 130a of the organic insulating film 130 from the conductive pattern 120 is easier than the separation of the insulating film removing material 13 from the projection 12.

As described above, the contact hole 140 may be formed in a simple method using the printing plate 10 coated with the insulating film removing material 13. Accordingly, it may be possible to avoid lengthening the fabrication processing time and the fabrication cost may not be increased from complicated processes as in the case of forming the contact hole using a photolithographic process.

Figure 5:
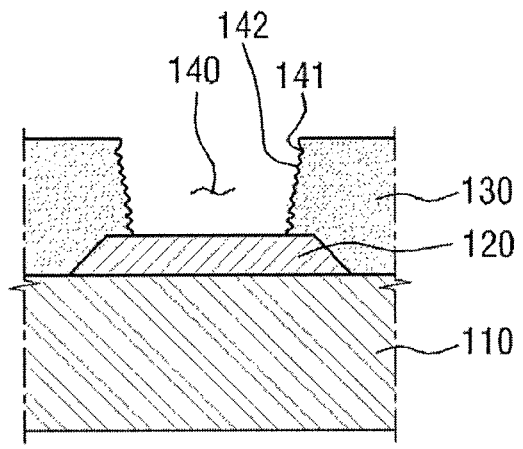
Figure 6:
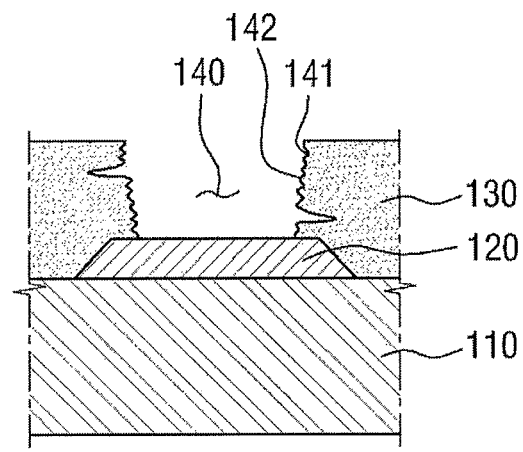

The contact hole 140 is formed by removing the first portion 130a of the organic insulating film 130 from the conductive pattern 120 by mechanical force using the printing plate 10 coated with the insulating film removing material 13, and thus the contact hole 140 may have an uneven inner wall as shown in FIGS. 5 and 6. That is, the inner wall of the contact hole 140 may have a plurality of concave portions 141 and a plurality of convex portions 142. Although FIG. 5 illustrates that differences in depth between the plurality of concave portions 141 are not so large, the depth of a part of the plurality of concave portions 141 may be more than twice the depth of other parts of the plurality of concave portions 141.

The contact hole 140 formed as above provides a space in which a contact 150 for electrically connecting the conductive pattern 120 to the other configuration of the micro electro device is formed. In the case that the contact hole 140 has the uneven inner wall, the contact area of the contact 150 is widened to help provide stable bonding of the contact 150.

Figure 7:
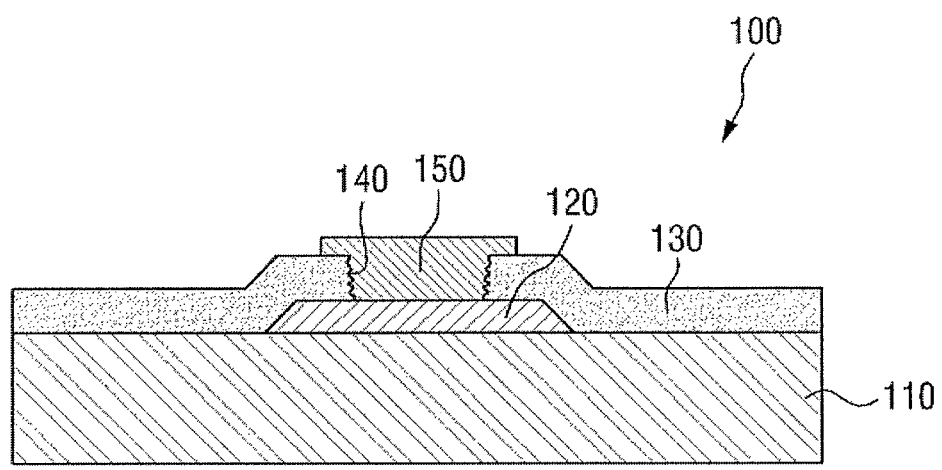

Referring to FIG. 7, the contact 150 is formed in the contact hole 140. The contact 150 may be formed of a second conductive material, for example, an organic conductive material, an inorganic conductive material, or a metal material. The contact 150 may be formed using an inkjet method, a deposition method, and the like.

Accordingly, the micro electro device 100, which may operate through electrical connection of the conductive pattern 120 to the other configuration through the contact 150, may be formed. Thus, the micro electro device 100 includes the substrate 110, the conductive pattern 120 formed on the upper portion of the substrate 110, the organic insulating film 130 formed on the upper portion of the substrate 110 to cover an edge of the conductive pattern 120, the contact hole 140 formed on the region that corresponds to the conductive pattern 120 to expose the conductive pattern 120 from the organic insulating film 130, and having the uneven inner wall, and the contact 150 formed in the contact hole 140.

Next, a method for fabricating a micro electro device according to another example embodiment will be described.

Figure 8:
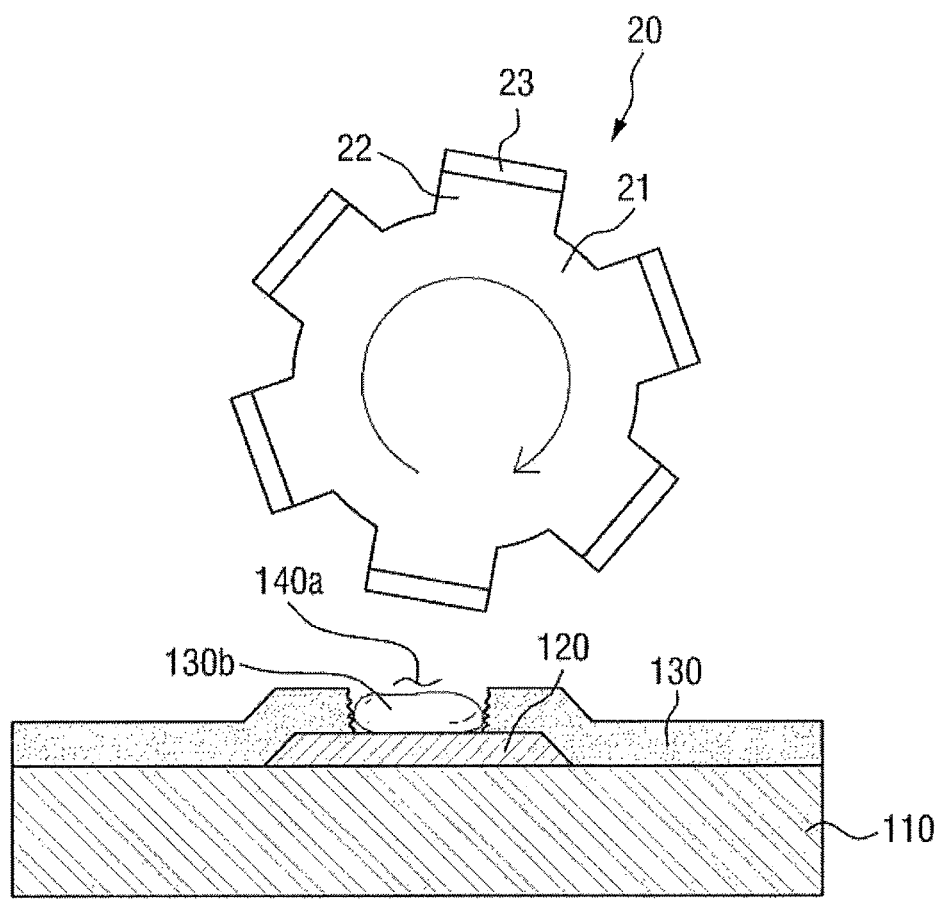
FIG. 8 is a cross-sectional view showing a contact hole forming step of a method for fabricating a micro electro device according to another example embodiment.

FIG. 8 is a cross-sectional view showing a contact hole forming step of a method for fabricating a micro electro device according to another example embodiment.

In the present example embodiment, the steps provided up to the step of forming an organic insulating film 130 on the whole surface of a substrate 110 to cover a conductive pattern 120 are the same as those according to the example embodiment in FIGS. 1 to 3.

In the present example embodiment, referring to FIG. 8, a printing plate 20 coated with an insulating film removing material 23 is prepared, and a contact hole 140a is formed by removing a first portion 130b of the organic insulating film 130 through making the insulating film removing material 23 come in contact with the first portion 130b of the organic insulating film 130 that corresponds to the conductive pattern 120. FIG. 8 illustrates that the first portion 130b of the organic insulating film 130 that corresponds to the conductive pattern 120 is dissolved by the insulating film removing material 23 and is in a liquid state.

In the present example embodiment, the printing plate 20 including a rotary body 21 and a plurality of projections 22 formed on an outer surface of the body 21 is prepared, and the insulating film removing material 23 is coated on the projections 22. The body 21 may be in a roll shape, and the width of the projection 22 may be the same as the width of the first portion 130b of the organic insulating film 130 to be removed. The insulating film removing material 23 may be made of a solvent that dissolves the organic insulating film 130. For example, the insulating film removing material 23 may be selected from toluene, ethyl alcohol, and propylene glycol monomethyl ether acetate. The toluene may be used in the case where the organic insulating film 130 is formed of polystyrene or polymethylmethacrylate. The ethyl alcohol may be used in the case where the organic insulating film 130 is formed of polyvinylalcohol. The propylene glycol monomethyl ether acetate may be used in the case where the organic insulating film 130 is formed of polyvinylphenol.

If the insulating film removing material 23 is made to come in contact with the first portion 130b of the organic insulating film 130 using the printing plate 20, the first portion 130b of the organic insulating film 130 is dissolved by the insulating film removing material 23 and is in a liquid state. Thereafter, the first portion 130b of the organic insulating film 130 that is in a liquid state is separated from the conductive pattern 120 through a separate cleaning process, and the like. Accordingly, a contact hole 140a may be formed.

As described above, the contact hole 140a may be formed in a simple method using the printing plate 20 coated with the insulating film removing material 23. Accordingly, it may possible to avoid lengthening the fabrication processing time and the fabrication cost may not be increased from complicated processes, as in the case of forming the contact hole using a photolithographic process.

In the present example embodiment, the contact hole 140a is formed by dissolving the first portion 130b of the organic insulating film 130 by a chemical action using the printing plate 20 coated with the insulating film removing material 23, and thus the contact hole 140a may also have an uneven inner wall like the contact hole 140 illustrated in FIGS. 5 and 6.

The contact hole 140a formed as above provides a space in which a contact for electrically connecting the conductive pattern 120 to the other configuration of the micro electro device is formed. The contact hole 140a may have the uneven inner wall. Thus, the contact area of the contact may be widened to help provide stable bonding of the contact.

In the present example embodiment, the step of forming the contact in the contact hole 140a is the same as that according to the example embodiment illustrated in FIG. 7.

Next, a method for fabricating a micro electro device according to still another example embodiment will be described.

Figure 9:
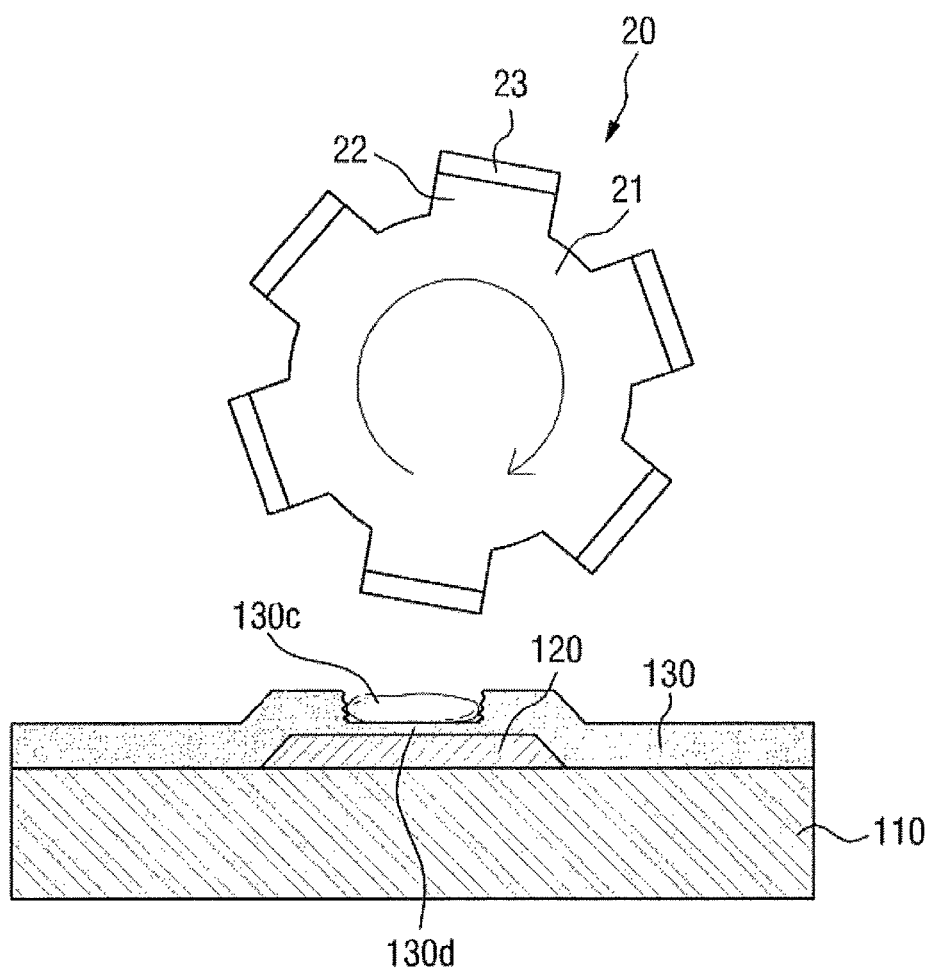
FIGS. 9 and 10 are cross-sectional views showing a contact hole forming step of a method for fabricating a micro electro device according to still another example embodiment.
Figure 10:
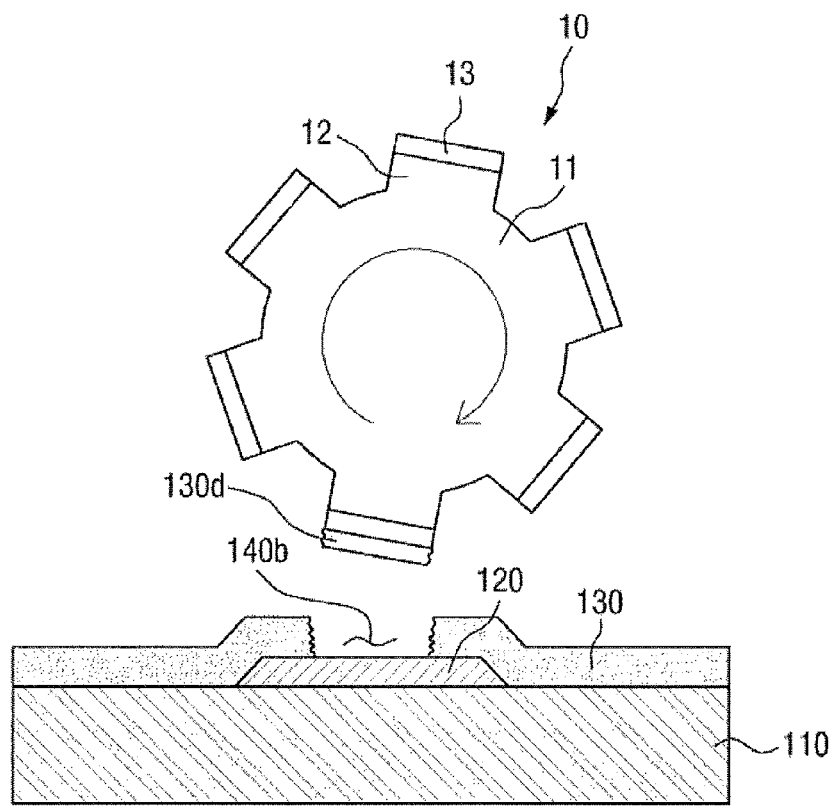

FIGS. 9 and 10 are cross-sectional view showing a contact hole forming step of a method for fabricating a micro electro device according to still another example embodiment.

In the present example embodiment, the steps provided up to the step of forming an organic insulating film 130 on the whole surface of a substrate 110 to cover a conductive pattern 120 are the same as those according to the example embodiment in FIGS. 1 to 3.

In the present example embodiment, referring to FIGS. 9 and 10, a first printing plate 10 coated with a first insulating film removing material 13 and a second printing plate 20 coated with a second insulating film removing material 23 are prepared, and a first portion 130c of the organic insulating film 130 is removed through making the second insulating film removing material 23 come in contact with the first portion 130c of the organic insulating film 130 that corresponds to the conductive pattern 120. If a second portion 130d of the organic insulating film 130 remains on the conductive pattern 120, a contact hole 140b is formed by removing the second portion 130d of the organic insulating film 130 through making the first insulating film removing material 13 come in contact with the second portion 130d of the organic insulating film 130. In the present example embodiment, the first printing plate 10 is the same as the printing plate 10 of FIG. 4 although its name is different from that of the printing plate 10 of FIG. 4, and the second printing plate 20 is the same as the printing plate 20 of FIG. 8 although its name is different from that of the printing plate 20 of FIG. 8. FIG. 9 illustrates that the first portion 130c of the organic insulating film 130 that corresponds to the conductive pattern 120 is dissolved by the insulating film removing material 23 and is in a liquid state, and FIG. 10 illustrates that the second portion 130d of the organic insulating film 130 is transferred to the first printing plate 10 by the insulating film removing material 13.

Of the first printing plate 10 and the second printing plate 20, the first portion 130c of the organic insulating film 130 is first dissolved by the second insulating film removing material 23 through making the second insulating film removing material 23 of the second printing plate 20 come in contact with the first portion 130c of the organic insulating film 130. If the second portion 130d of the organic insulating film 130 remains on the conductive pattern 120, the first insulating film removing material 13 is made to come in contact with the second portion 130d of the organic insulating film 130 using the first printing plate 10. That is, the first insulating film removing material 13 is made to come in close contact with the second portion 130d of the organic insulating film 130 while the first body 11 is made to be rotated through application of pressure to the first printing plate 10, and the second portion 130d of the organic insulating film 130 is separated from the conductive pattern 120 in a state where the second portion 130d of the organic insulating film 130 is in close contact with the first insulating film removing material 13. Accordingly, the contact hole 140b may be formed.

As described above, the contact hole 140b may be formed in a simple method using the second printing plate 20 coated with the second insulating film removing material 23 and the first printing plate 10 coated with the first insulating film removing material 13. Accordingly, it may be possible to avoid lengthening the fabrication processing time and the fabrication cost may not be increased from complicated processes, as in the case of forming the contact hole using a photolithographic process.

In the present example embodiment, the contact hole 140b is formed by dissolving the first portion 130c of the organic insulating film 130 by a chemical action using the second printing plate 20 coated with the second insulating film removing material 23 and removing the second portion 130d of the organic insulating film 130 by mechanical force using the first printing plate 10 coated with the first insulating film removing material 13, and thus the contact hole 140b may have an uneven inner wall like the contact hole 140 shown in FIGS. 5 and 6.

The contact hole 140b formed as above provides a space in which a contact for electrically connecting the conductive pattern 120 to the other configuration of the micro electro device is formed. The contact hole 140b may have the uneven inner wall. Thus, the contact area of the contact may be widened to help provide stable bonding of the contact.

In the present example embodiment, the step of forming the contact in the contact hole 140b is the same as that according to the example embodiment illustrated in FIG. 7.

Next, a method for fabricating an organic light emitting display device according to still another example embodiment using the method for fabricating the micro electro device according to an example embodiment will be described.

FIGS. 11 to 16 are cross-sectional views showing processing steps of a method for fabricating an organic light emitting display device according to still another example embodiment.

Figure 11:
FIGS. 11 to 16 are cross-sectional views showing processing steps of a method for fabricating an organic light emitting display device according to still another example embodiment.

In the present example embodiment, first, referring to FIG. 11, a substrate 210 is prepared. The substrate 210 may be an insulating substrate, such as glass, quartz, sapphire, plastic, and the like, like the substrate 110 in FIG. 1, or a semiconductor substrate.

Figure 12:
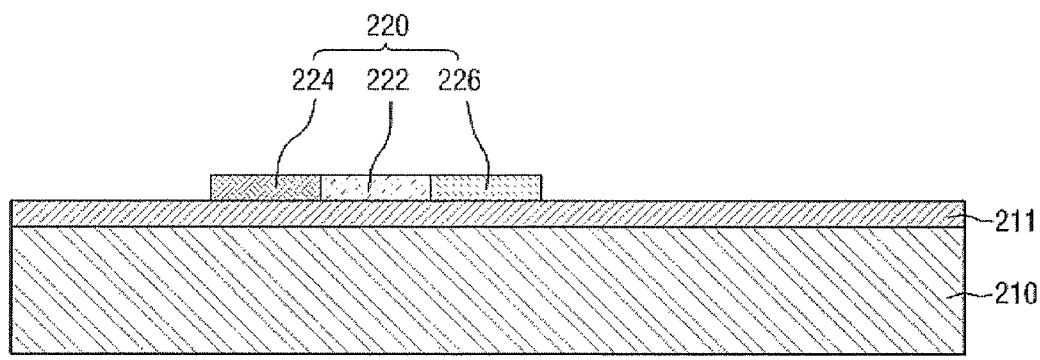

Referring to FIG. 12, an active layer 220, which includes a channel region 222 and a source region 224 and a drain region 226 formed on respective sides of the channel region 222, is formed on the substrate 210.

For example, a semiconductor material, such as amorphous silicon or polysilicon, is formed on the whole surface of the substrate 210 using a chemical vapor deposition method, and the like, and the semiconductor material is patterned using a photolithographic processing method, and the like. Then, the source region 224 and the drain region 226 are formed by injecting p-type impurities or n-type impurities into both sides around the channel region 222 that is the center region of the patterned semiconductor material using an ion injection method, and the like.

A buffer layer 211 may be formed on the whole surface of the substrate 210 before the active layer 220 is formed. The buffer layer 211 serves to prevent permeation of impure elements and to perform planarization of the surface of the substrate 210, and may be formed of various materials that may perform such functions. However, the buffer layer 211 is not necessarily used, and may be omitted depending on the kind and processing conditions of the substrate 210.

Figure 13:
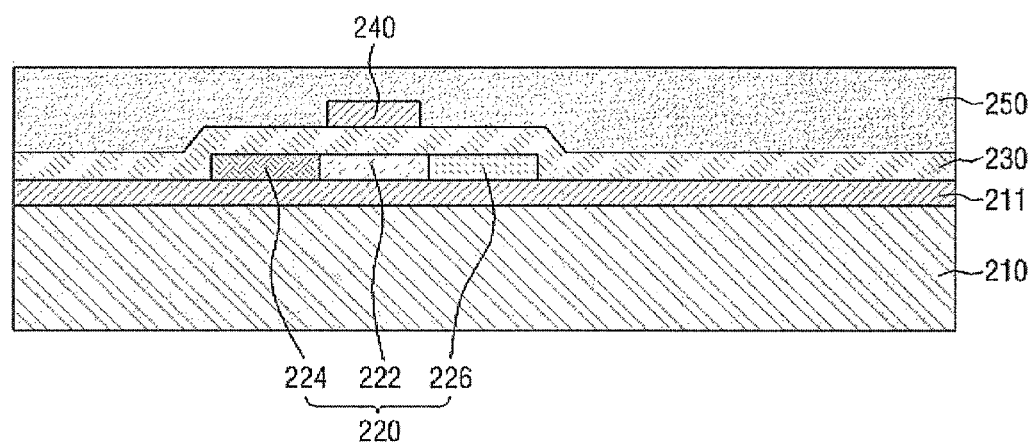

Referring to FIG. 13, an organic gate insulating film 230 is formed on the whole surface of the substrate 210 to cover the active layer 220. The forming material and the forming method of the organic gate insulating film 230 are the same as the forming material and the forming method of the organic insulating film 130 illustrated in FIG. 3.

As described above, the organic gate insulating film 230 may be formed of an organic insulating material so that a coating or printing method may be used. Thus, the size of the substrate 210, on which the organic gate insulating film 230 is formed, may not be limited, and the fabricating time may not be lengthened. Accordingly, it may be prevented that the size of the substrate that may be used is limited and it takes long time to release the vacuum state after the formation of the insulating film is completed in the case where the gate insulating film is formed of an inorganic insulating material so that the vacuum deposition method using the vacuum deposition equipment is used.

A gate electrode 240 is formed in a region that corresponds to the channel region of an upper portion of the organic gate insulating film 230. The gate electrode 240 may be formed of a first conductive material, for example, an organic conductive material, an inorganic conductive material, or a metal material.

As the organic conductive material, polythiophene, polyaniline, polyacetylene, polypyrrole, polyphenylene vinylene, polyethylenedioxythiophene (PEDOT): polystyrenesulfonate (PSS), and the like may be selected. As the inorganic conductive material, indium tin oxide (ITO), indium zinc oxide (IZO), and the like may be selected. As the metal material, gold (Au), silver (Au), aluminum (Al), nickel (Ni), molybdenum (Mo), tungsten (W), and the like may be selected.

The gate electrode 240 may be formed by depositing the first conductive material on the whole surface of the substrate 210 using chemical vapor deposition (CVD) and physical vapor deposition (PVD), and the like and patterning the deposited material through a photolithographic process. Further, the gate electrode 240 may be formed by directly printing the substrate 210 in an inkjet printing method, a gravure printing method, and the like. In this case, the above-described photolithographic process may be omitted.

An interlayer insulating film 250 is formed on the whole surface of the organic gate insulating film 230 to cover the gate electrode 240. The interlayer insulating film 250 may be formed of an organic insulating material such as the organic gate insulating film 230, for example, may be formed of at least one of polystyrene, polyvinylalcohol, polyvinylphenol, and polymethylmethacrylate.

The interlayer insulating film 250 may be formed using methods of spin coating, roll-to-roll printing, screen printing, inkjet printing, and the like. As the roll-to-roll printing method, for example, gravure printing, offset printing, flexographic printing, and the like may be used.

Figure 14:
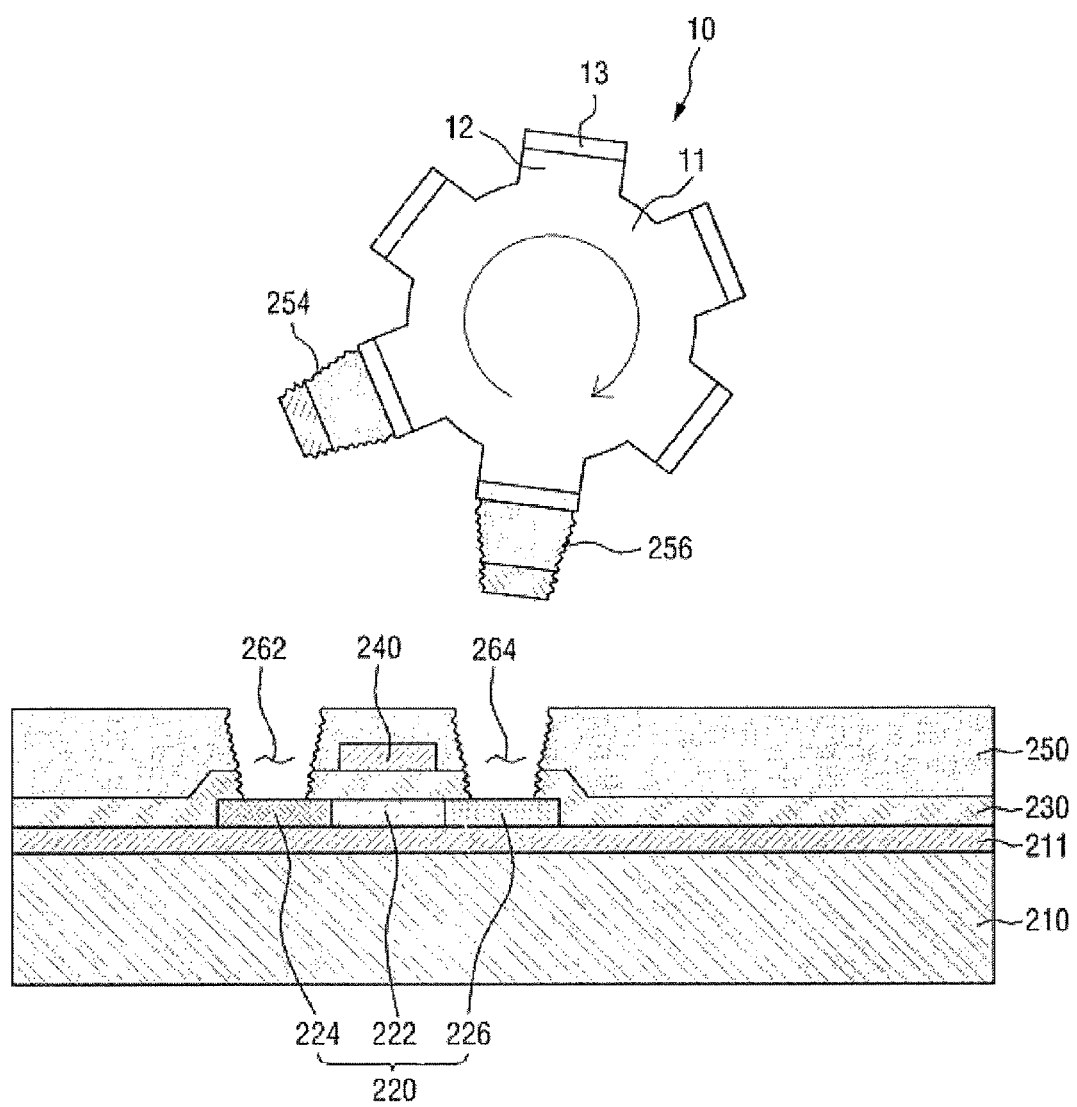

Referring to FIG. 14, a printing plate 10 coated with an insulating film removing material 13 is prepared, and a first contact hole 262 and a second contact hole 264 are formed by removing a first portion 254, which corresponds to the source region 224, and a second portion 256, which corresponds to the drain region 226, of the organic gate insulating film 230 and the interlayer insulating film 250, through making the insulating film removing material 13 come in contact with the first portion 254 and the second portion 256. The printing plate 10 that is used in the present example embodiment is the same as the printing plate 10 of FIG. 4. However, the insulating film removing material 13 that is coated on the projections 12 of the plate 10 used in the present example embodiment may be a material having higher surface energy than surface energy of the organic gate insulating film 230 and surface energy of the interlayer insulating film 250. FIG. 14 illustrates a state where the first portion 254, which corresponds to the source region 224, and the second portion 256, which corresponds to the drain region 226, of the organic gate insulating film 230 and the interlayer insulating film 250 have been transferred to the printing plate 10 by the insulating film removing material 13.

For example, the insulating film removing material 13 that is coated on one projection 12 is made to come in contact with the first portion 254 of the organic gate insulating film 230 and the interlayer insulating film 250 using the printing plate 10, the insulating film removing material 13 is made to come in close contact with the first portion 254 of the organic gate insulating film 230 and the interlayer insulating film 250 while the body 11 is rotated through application of pressure to the printing plate 10, and the first portion 254 of the organic gate insulating film 230 and the interlayer insulating film 250 is separated from the source region 224 in a state where the first portion 254 of the organic gate insulating film 230 and the interlayer insulating film 250 is in close contact with the insulating film removing material 13. Accordingly, a first contact hole 262 may be formed.

Further, the insulating film removing material 13 that is coated on another projections 12 is made to come in contact with the second portion 256 of the organic gate insulating film 230 and the interlayer insulating film 250 through rotation of the printing plate 10, the insulating film removing material 13 is made to come in close contact with the second portion 256 of the organic gate insulating film 230 and the interlayer insulating film 250 while the body 11 is rotated through application of pressure to the printing plate 10, and the second portion 256 of the organic gate insulating film 230 and the interlayer insulating film 250 is separated from the drain region 226 in a state where the second portion 256 of the organic gate insulating film 230 and the interlayer insulating film 250 is in close contact with the insulating film removing material 13. Accordingly, a second contact hole 264 may be formed.

As described above, the first contact hole 262 and the second contact hole 264 may be formed in a simple method using the printing plate 10 coated with the insulating film removing material 13. Accordingly, it may be prevented that the fabrication processing time is lengthened and the fabrication cost is increased due to the complicated processes in the case of forming the contact hole using the photolithographic process.

In the present example embodiment, the first contact hole 262 and the second contact hole 264 are formed by removing the first portion 254 and the second portion 256 of the organic gate insulating film 230 and the interlayer insulating film 250 from the source region 224 and the drain region 226 by mechanical force using the printing plate 10 coated with the insulating film removing material 13, and thus the first contact hole 262 and the second contact hole 264 may have uneven inner walls like the contact hole 140 shown in FIGS. 5 and 6.

The first contact hole 262 formed as above provides a space in which a first contact C1 of a source electrode 272 for electrically connecting the source region 224 to a common power line (not illustrated) is formed. The first contact hole 262 may have the uneven inner wall. Thus, the contact area of the first contact C1 may be widened to help provide stable bonding of the first contact C1. Further, the second contact hole 264 provides a space in which a second contact C2 of a drain electrode 274 for electrically connecting the drain region 226 to a first electrode 284 is formed. The second contact hole 264 may have the uneven inner wall. Thus, the contact area of the second contact C2 may be widened to help provide stable bonding of the second contact C2.

Figure 15:
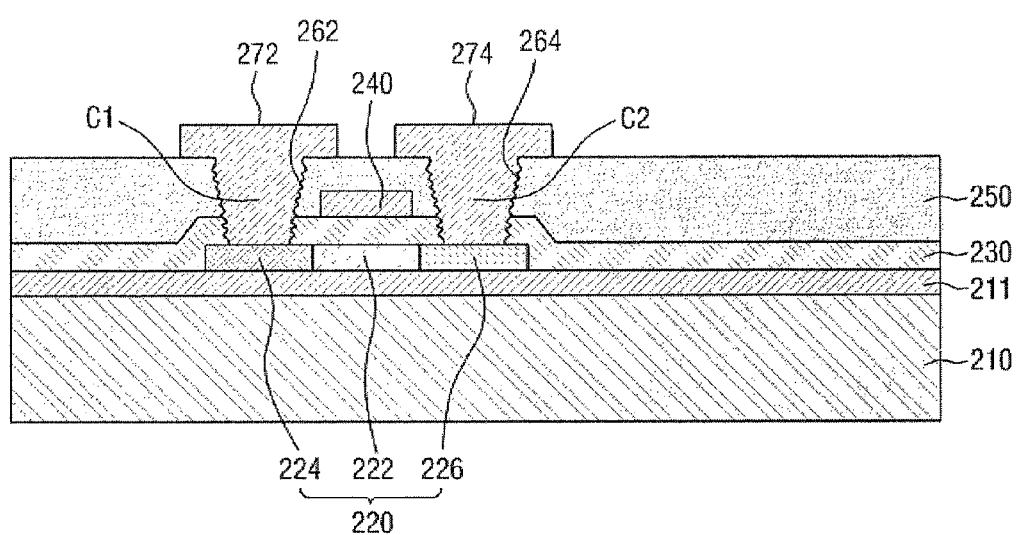

Referring to FIG. 15, the source electrode 272, which includes the first contact C1 positioned in the first contact hole 262 and extends from the first contact C1 to an upper portion of the interlayer insulating film 250, is formed, and the drain electrode 274, which includes the second contact C2 positioned in the second contact hole 264 and extends from the second contact C2 to the upper portion of the interlayer insulating film 250, is formed. The source electrode 272 and the drain electrode 274 may be formed of a second conductive material, for example, an organic conductive material, an inorganic conductive material, or a metal material. The source electrode 272 and the drain electrode 274 may be formed using an inkjet printing method or a depositing method, etc.

As described above, by forming the source electrode 272 including the first contact C1 and the drain electrode 274 including the second contact C2, the source region 224 and the common power line (not illustrated) may be electrically connected to each other, and the drain region 226 and the first electrode 284 may be electrically connected to each other. The above-described active layer 220, organic gate insulating film 230, gate electrode 240, interlayer insulating film 250, source electrode 272, and drain electrode 274 may constitute a thin film transistor that is used as a switching device for controlling the operation of each pixel or a driving device for driving each pixel in an organic light emitting display device.

Figure 16:
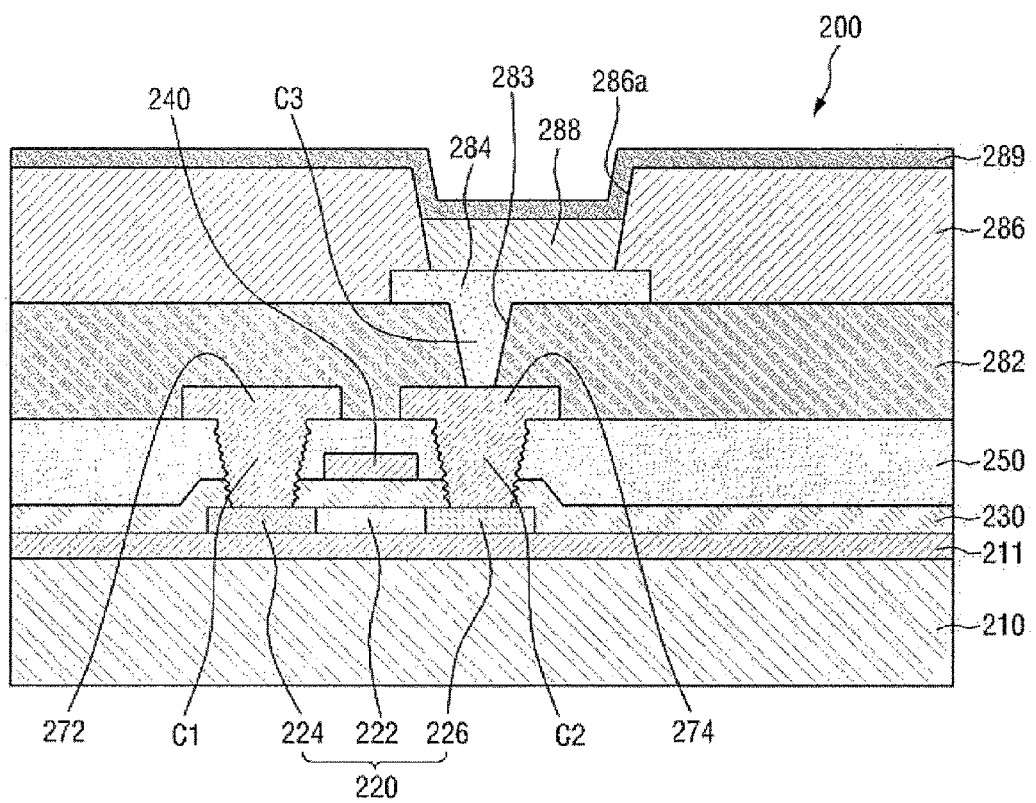

Referring to FIG. 16, a planarization film 282 is formed on the whole surface of the interlayer insulating film 250 to cover the source electrode 272 and the drain electrode 274, and a third contact hole 283 is formed. The planarization film 282 is formed to include an inorganic insulating material or an organic insulating material having superior planarization characteristics. The planarization film 282 may be formed using methods of chemical vapor deposition or physical vapor deposition, etc., and may be formed using methods of spin coating, roll-to-roll printing, and screen printing, etc. As the roll-to-roll printing method, for example, gravure printing, offset printing, flexographic printing, etc., may be used. The third contact hole 283 may be formed by patterning the planarization film 282 using a photolithographic processing method, and the like. Further, the third contact hole 283 may be formed using the same method as the method of forming the first contact hole 262 and the second contact hole 264. In this case, the inner wall of the third contact hole 283 may be uneven like the inner walls of the first contact hole 262 and the second contact hole 264.

Further, the first electrode 284, which includes a third contact C3 positioned in the third contact hole 283 and extends from the third contact C3 to an upper portion of the planarization film 282, is formed. The first electrode 284 may be used as an anode electrode for providing holes to an organic light emitting layer 288 or a cathode electrode for providing electrons to the organic light emitting layer 288. The first electrode 284 may be formed of a third conductive material, for example, an organic conductive material, an inorganic conductive material, or a metal material. The first electrode 284 may be formed using a photo process and an inkjet printing method, and the like.

As described above, by forming the first electrode 284 that includes the third contact C3, the drain electrode 274 and the organic light emitting layer 288 may be electrically connected to each other.

Further, a pixel-defining film 286 is formed on the whole surface of the planarization film 282 to cover the first electrode 284, and an opening 286a is formed in a region of the pixel-defining film 286 that corresponds to the first electrode 284. The pixel-defining film 286 may be formed of an insulating material, for example, may be formed to include at least one organic material selected from benzo cyclo butene (BCB), polyimide (PI), poly amaide (PA), acrylic resin, and phenol resin, and the like. As another example, the pixel-defining film 286 may be formed to include an organic material, such as silicon nitride, and the like. The pixel-defining film 286 may be formed using methods of chemical vapor deposition (CVD), physical vapor deposition (PVD), and the like. The opening 286a may be formed by patterning the pixel-defining film 286 for each pixel through a photolithographic processing method, and the like. As still another example, the pixel-defining film 286 having the opening 286a may be formed through direct printing in an inkjet printing, gravure printing method, and the like.

Further, the organic light emitting layer 288 is formed on the pixel electrode 284 that is exposed through the opening 286a of the pixel-defining film 286. The organic light emitting layer 288 may be formed to include at least one of a red organic light emitting material, a green organic light emitting material, and a blue organic light emitting material. The organic light emitting layer 288 may be formed using an inkjet printing method, and the like.

Then, a second electrode 289 is formed on the organic light emitting layer 288. The second electrode 289 may be used as a cathode electrode for providing electrons to the organic light emitting layer 288 or an anode electrode for providing holes thereto. The second electrode 289 may be formed of a fourth conductive material, for example, an organic conductive material, an inorganic conductive material, or a metal material.

Accordingly, an organic light emitting display device 200, which emits light through recombination of the holes provided from the first electrode 284 and the electrons provided from the second electrode 289, may be fabricated.

Although not illustrated, the method for fabricating an organic light emitting display device 200 according to still another example embodiment may further include arranging an encapsulation substrate on an upper portion of the second electrode 289. Further, the method for fabricating an organic light emitting display device 200 according to still another example embodiment may further include arranging spacers between the second electrode 289 and the encapsulation substrate.

Next, a method for fabricating an organic light emitting display device according to yet still another example embodiment will be described.

FIGS. 17 to 22 are cross-sectional views showing processing steps of a method for fabricating an organic light emitting display device according to yet still another example embodiment.

In the present example embodiment, the step of preparing the substrate 210 is the same as that in the embodiment of FIG. 11.

Figure 17:
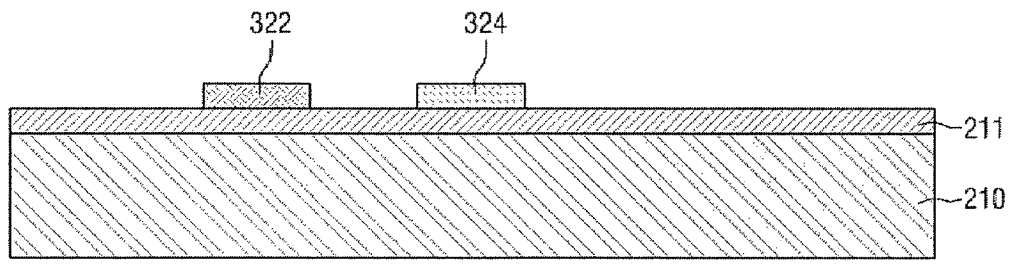
FIGS. 17 to 22 are cross-sectional views showing processing steps of a method for fabricating an organic light emitting display device according to yet still another example embodiment.

In the present example embodiment, referring to FIG. 17, a source region 322 and a drain region 324, which are spaced apart from each other, are formed on the substrate 210.

For example, the source region 322 and the drain region 324 may be formed of an organic conductive material, for example, may be formed of any one selected from polythiophene, polyaniline, polyacetylene, polypyrrole, polyphenylene vinylene, and polyethylenedioxythiophene (PEDOT): polystyrenesulfonate (PSS). The source region 322 and the drain region 324 are formed of the organic conductive material. Thus, they may be directly formed on the substrate 210 in an inkjet printing, gravure printing method and the like.

A buffer layer 211 may be formed on the substrate 210 before the source region 322 and the drain region 324 are formed. Since the buffer layer 211 has been described with reference to FIG. 12, a duplicated description thereof will be omitted.

Figure 18:
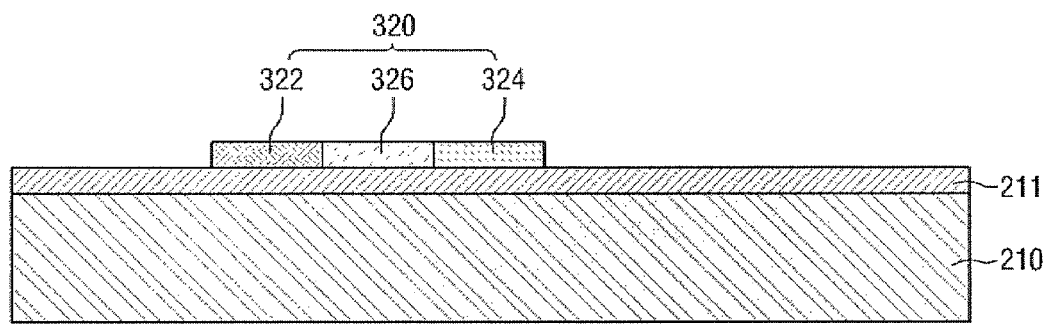

Referring to FIG. 18, a channel region 326 is formed between the source region 322 and the drain region 324. The channel region 326 may be formed of an organic semiconductor material, for example, may be formed of pentacene, tetracene, copper phthalaocyanine, polythiopene, polyaniline, polyacetylene, polypyrrole, polyphenylenevinylene, or derivatives thereof, but is not limited thereto. The channel region 326 may be formed of an organic semiconductor material, and may be directly formed on the substrate 210 in methods of vapor deposition, inkjet printing, and gravure printing, and the like. The source region 322, the drain region 324, and the channel region 326 form an active layer 320.

Figure 19:
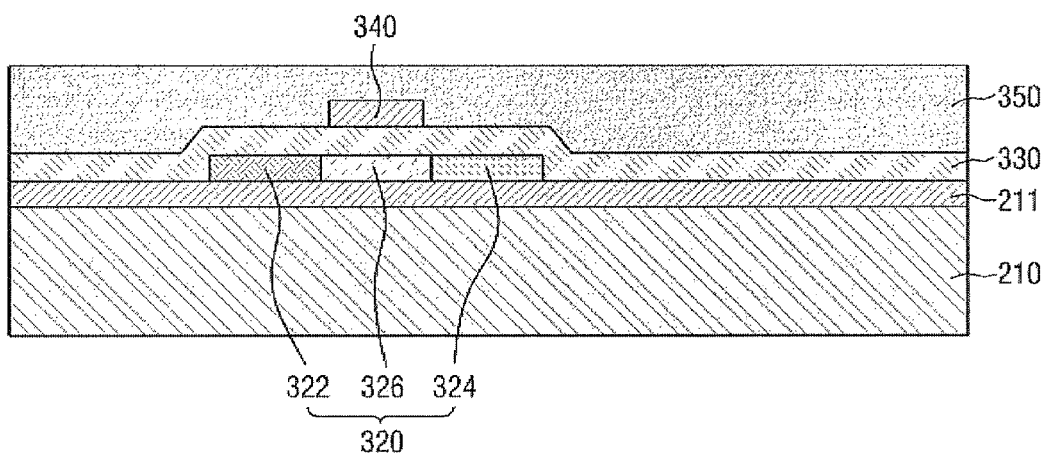

Referring to FIG. 19, an organic gate insulating film 330 is formed on the whole surface of the substrate 210 to cover the source region 322, the drain region 324, and the channel region 326. The forming material and the forming method of the organic gate insulating film 330 are the same as the forming material and the forming method of the organic gate insulating film 230 of FIG. 13.

Further, a gate electrode 340 is formed on an upper portion of the organic gate insulating film 330 that corresponds to the channel region 326. The gate electrode 340 may be formed of an organic conductive material, for example, may be formed of at least one selected from polythiophene, polyaniline, polyacetylene, polypyrrole, polyphenylene vinylene, and polyethylenedioxythiophene (PEDOT): polystyrenesulfonate (PSS). The organic gate electrode 340 may be formed of the organic conductive material, and may be directly formed on the organic gate insulating film 330 in an inkjet printing, gravure printing method, and the like.

Further, an interlayer insulating film 350 is formed on the whole surface of the organic gate insulating film 330 to cover the gate electrode 340. The forming material and the forming method of the interlayer insulating film 350 are the same as the forming material and the forming method of the interlayer insulating film 250 of FIG. 13.

Figure 20:
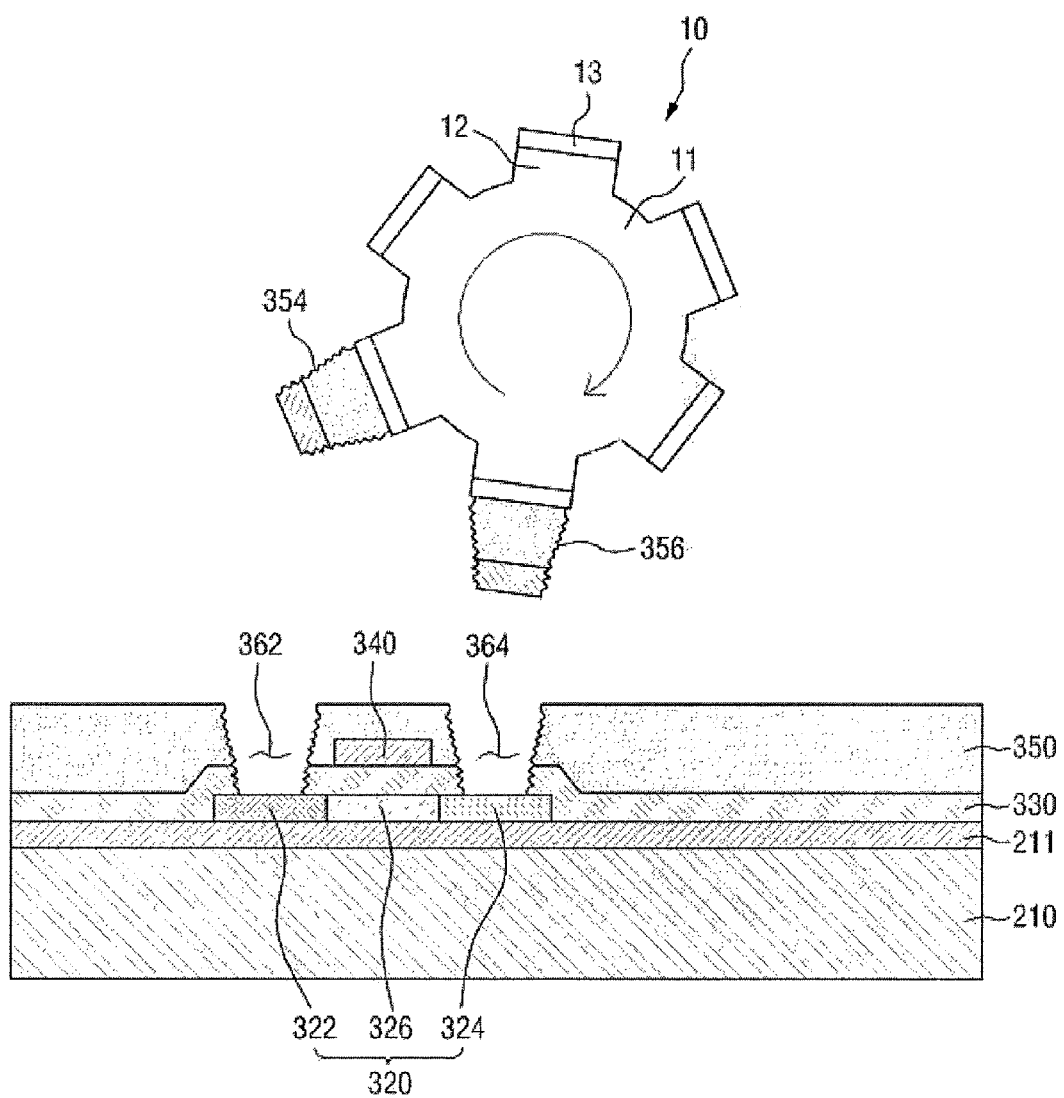

Referring to FIG. 20, a printing plate 10 coated with an insulating film removing material 13 is prepared, and a first contact hole 362 and a second contact hole 364 are formed by removing a first portion 354, which corresponds to a source region 322, and a second portion 356, which corresponds to a drain region 324, of the organic gate insulating film 330 and the interlayer insulating film 350, through making the insulating film removing material 13 come in contact with the first portion 354 and the second portion 356. The printing plate 10 that is used in the present example embodiment is the same as the printing plate 10 of FIG. 4. However, the insulating film removing material 13 that is coated on the projections 12 of the plate 10 used in the present example embodiment may be a material having higher surface energy than surface energy of the organic gate insulating film 330 and surface energy of the interlayer insulating film 350. FIG. 20 illustrates a state where the first portion 354, which corresponds to the source region 322, and the second portion 356, which corresponds to the drain region 324, of the organic gate insulating film 330 and the interlayer insulating film 350 have been transferred to the printing plate 10 by the insulating film removing material 13.

The forming method of the first contact hole 362 and the second contact hole 364 are the same as the forming method of the first contact hole 262 and the second contact hole 264 of FIG. 14.

As described above, the first contact hole 362 and the second contact hole 364 may be formed in a simple method using the printing plate 10 coated with the insulating film removing material 13. Accordingly, it may be prevented that the fabrication processing time is lengthened and the fabrication cost is increased due to the complicated processes in the case of forming the contact hole using a photolithographic process.

In the present example embodiment, the first contact hole 362 and the second contact hole 364 are formed by removing the first portion 354 and the second portion 356 of the organic gate insulating film 330 and the interlayer insulating film 350 from the source region 322 and the drain region 324 by mechanical force using the printing plate 10 coated with the insulating film removing material 13, and thus the first contact hole 362 and the second contact hole 364 may have uneven inner walls like the contact hole 140 shown in FIGS. 5 and 6.

The first contact hole 362 formed as above provides a space in which a first contact C1 of a source electrode 372 for electrically connecting the source region 322 to a common power line (not illustrated) is formed. The first contact hole 362 may have the uneven inner wall. Thus, the contact area of the first contact C1 may be widened to help provide stable bonding of the first contact C1. Further, the second contact hole 364 provides a space in which a second contact C2 of a drain electrode 374 for electrically connecting the drain region 324 to a first electrode 384 is formed. The second contact hole 364 may have the uneven inner wall. Thus, the contact area of the second contact C2 may be widened to help provide stable bonding of the second contact C2.

Figure 21:
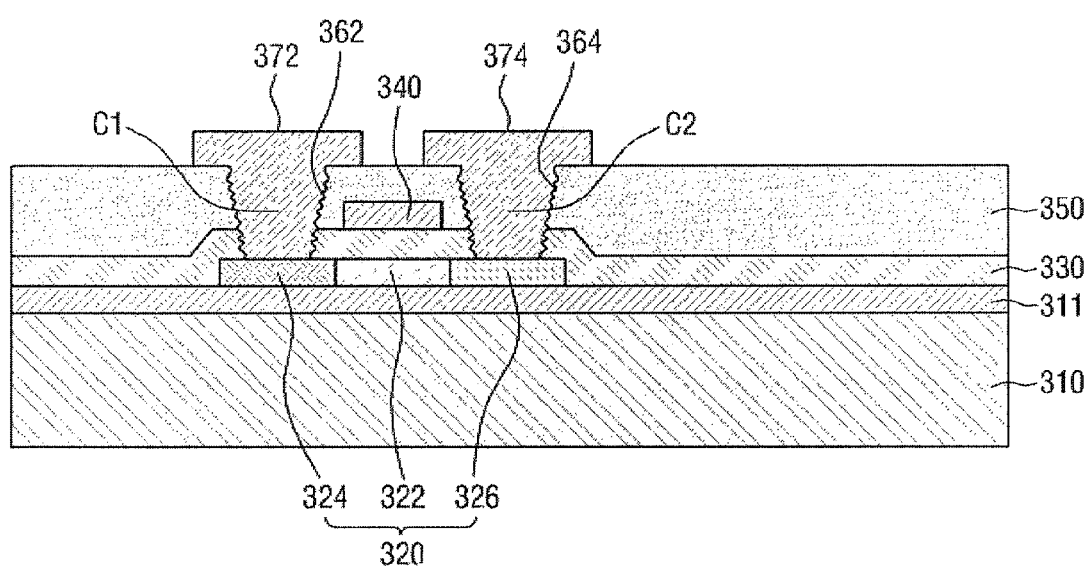

Referring to FIG. 21, the source electrode 372, which includes the first contact C1 positioned in the first contact hole 362 and extends from the first contact C1 to an upper portion of the interlayer insulating film 350, is formed, and the drain electrode 374, which includes the second contact C2 positioned in the second contact hole 364 and extends from the second contact C2 to the upper portion of the interlayer insulating film 350, is formed. The source electrode 372 and the drain electrode 374 may be formed of a second conductive material, for example, an organic conductive material. The source electrode 372 and the drain electrode 374 may be formed using an inkjet printing method, and the like.

As described above, by forming the source electrode 372 including the first contact C1 and the drain electrode 374 including the second contact C2, the source region 324 and the common power line (not illustrated) may be electrically connected to each other, and the drain region 324 and the first electrode 384 may be electrically connected to each other. The above-described active layer 320, organic gate insulating film 330, gate electrode 340, interlayer insulating film 350, source electrode 372, and drain electrode 374 are formed of an organic material. Accordingly, they may constitute an organic thin film transistor that is used as a switching device for controlling the operation of each pixel or a driving device for driving each pixel in an organic light emitting display device. The organic thin film transistor may be simply formed in a coating or printing method instead of the vacuum deposition method.

Figure 22:
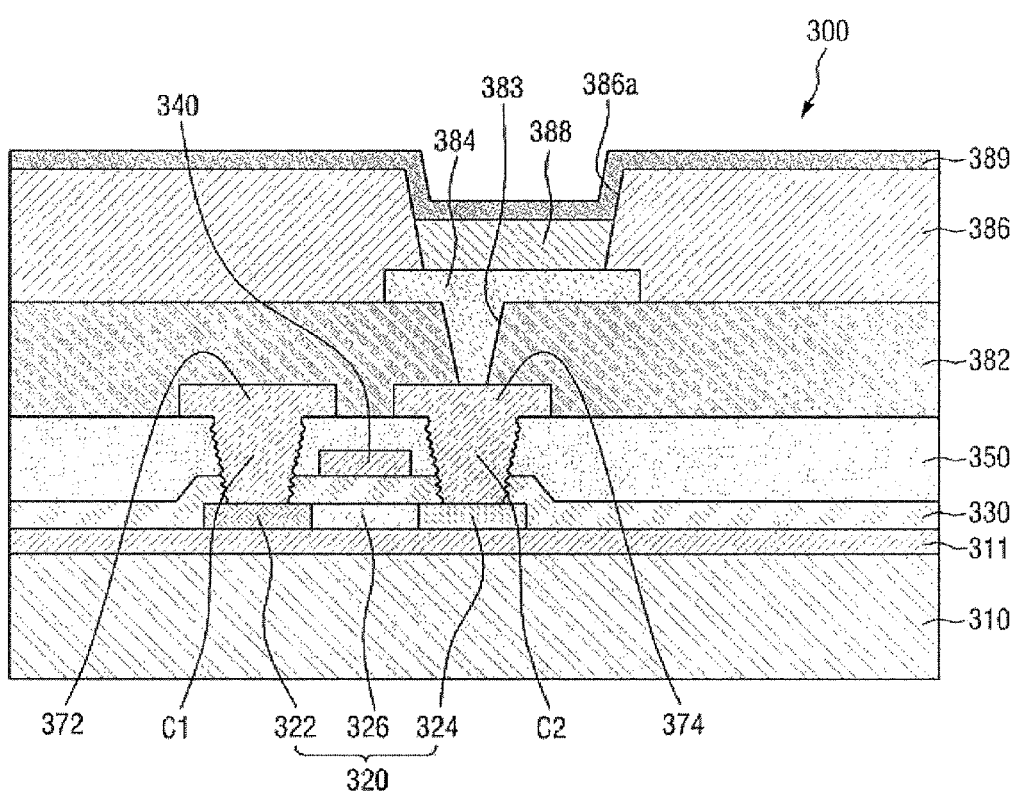

Referring to FIG. 22, a planarization film 382 is formed on the whole surface of the interlayer insulating film 350 to cover the source electrode 372 and the drain electrode 374, and a third contact hole 383 is formed. The planarization film 382 is formed to include an organic insulating material having superior planarization characteristics. The planarization film 382 may be formed of an organic insulating material. Thus, it may be formed in a form in which the third contact hole 383 is directly provided on the interlayer insulating film 350 using methods of roll-to-roll printing, screen printing, and inkjet printing, and the like. As the roll-to-roll printing method, for example, gravure printing, offset printing, flexographic printing, and the like may be used.

Further, the first electrode 384, which includes a third contact C3 positioned in the third contact hole 383 and extends from the third contact C3 to an upper portion of the planarization film 382, is formed. The first electrode 384 may be used as an anode electrode for providing holes to an organic light emitting layer 388 or a cathode electrode for providing electrons thereto. The first electrode 384 may be formed of a third conductive material, for example, an organic conductive material, an inorganic conductive material, or a metal material. The first electrode 384 may be formed using an inkjet printing method, a deposition method, and the like.

As described above, by forming the first electrode 384 that includes the third contact C3, the drain electrode 374 and the organic light emitting layer 388 may be electrically connected to each other.

Further, a pixel-defining film 386 is formed on the whole surface of the planarization film 382 to cover the first electrode 384, and an opening 386a is formed in a region of the pixel-defining film 386 that corresponds to the first electrode 384. The pixel-defining film 386 may be formed of an organic insulating material, for example, may be formed to include at least one selected from benzo cyclo butene (BCB), polyimide (PI), poly amaide (PA), acrylic resin, and phenol resin, and the like. The pixel-defining film 386 may be formed of an organic insulating material. Thus, it may be formed in the form in which an opening 386a is directly provided on the planarization film 382 using methods of roll-to-roll printing, screen printing, and inkjet printing, and the like. As the roll-to-roll printing method, for example, gravure printing, offset printing, flexographic printing, and the like may be used.

Further, the organic light emitting layer 388 is formed on the first electrode 384 that is exposed through the opening 386a of the pixel-defining film 386. The forming material and the forming method of the organic light emitting layer 388 are the same as the forming material and the forming method of the organic light emitting layer 288 illustrated in FIG. 16.

Then, a second electrode 389 is formed on the organic light emitting layer 388. The second electrode 389 may be used as a cathode electrode for providing electrons to the organic light emitting layer 388 or an anode electrode for providing holes thereto. The second electrode 389 may be formed of a fourth conductive material, for example, an organic conductive material, an inorganic conductive material, or a metal material.

Accordingly, an organic light emitting display device 300, which emits light through recombination of the holes provided from the first electrode 384 and the electrons provided from the second electrode 389, may be fabricated.

Although not illustrated, the method for fabricating an organic light emitting display device 300 according to still another example embodiment may further include arranging an encapsulation substrate on an upper portion of the second electrode 389. Further, the method for fabricating an organic light emitting display device 300 according to still another example embodiment may further include arranging spacers between the second electrode 389 and the encapsulation substrate.

Although it is described that the method for fabricating the organic light emitting display device illustrated in FIGS. 11 to 22 use the method for fabricating the micro electro device illustrated in FIGS. 1 to 7, it is also possible to use the methods for fabricating the micro electro device illustrated in FIGS. 8 to 10.

By way of summation and review, a thin film transistor may include an active layer having a source region and a drain region (conductive pattern), a gate insulating film (insulating film), a gate electrode, a source electrode, a drain electrode, and the like, which are formed on a substrate. The gate insulating film may be formed by depositing $SiO_2$ or SiNx, which is an inorganic insulating material, on the substrate on which the active layer is formed, using a vacuum deposition method. Thereafter, a contact hole for exposing the source region and the drain region may be formed on the gate insulating film through a photolithographic process, and a contact may be formed by filling the contact hole with a conductive material. Accordingly, through the contact, the source region and the source electrode are electrically connected to each other, and the drain region and the drain electrode are electrically connected to each other.

Once vacuum deposition equipment that is used to form the gate insulating film on the substrate is set, it may be difficult to change the equipment itself, and thus the size of the substrate that may be used may be limited. Further, the vacuum state, which is created when the gate insulating film is formed using the vacuum deposition method, should be released after the formation of the gate insulating film is completed. However, it may take a long time to release the vacuum state. Further, in the case of forming the contact hole on the gate insulating film using the photolithographic process, fabricating time may be lengthened and fabricating costs may be increased due to complicated processes.

As described above, embodiments may provide a method for fabricating a micro electro device and a micro electro device fabricated thereby, which may prevent the size of a substrate that may be used from being limited and may reduce fabricating processes and fabricating costs by forming an insulating film on the substrate through a coating or printing method, etc., with an organic insulating material and forming a contact hole on the insulating film in a simple method using a printing plate.

Embodiments may provide a method for fabricating an organic light emitting display device and an organic light emitting display device fabricated thereby, which may prevent the size of a substrate that may be used from being limited and may reduce fabricating processes and fabricating costs by forming a gate insulating film on the substrate through a coating or printing method, etc., with an organic insulating material and forming a contact hole on the gate insulating film in a simple method using a printing plate.

According to the method for fabricating a micro electro device according to an example embodiment, the size of the substrate that may be used may be prevented from being limited and the fabricating processes and the fabricating costs may be reduced by forming the insulating film on the substrate through the coating or printing method, etc., with the organic insulating material and forming the contact hole on the insulating film in a simple method using the printing plate.

Further, the micro electro device that is fabricated by the method for fabricating a micro electro device according to an example embodiment may include the contact hole having an uneven inner wall. Thus, it may be possible to make the contact be stably bonded to the contact hole through widening of the contact area between the contact, which electrically connects the conductive pattern and another configuration to each other, and the contact hole.

Further, according to the method for fabricating an organic light emitting display device according to another example embodiment, the size of the substrate that may be used may be prevented from being limited and the fabricating processes and the fabricating costs may be reduced by forming the gate insulating film on the substrate through the coating or printing method, etc., with the organic insulating material and forming the contact hole on the gate insulating film in the simple method using the printing plate.

Further, the organic light emitting display device fabricated by the method for fabricating an organic light emitting display device according to another example embodiment may include the first contact hole and the second contact hole having uneven inner walls. Thus, it may be possible to make the first contact and the second contact be stably bonded to the first contact hole and the second contact hole, respectively, through widening of the contact area between the first contact for connecting the source region and the source electrode to each other and the first contact hole and widening of the contact area between the second contact for connecting the drain region and the drain electrode to each other and the second contact hole.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a micro electro device, the method comprising:
    forming a conductive pattern on a substrate;
    forming an organic insulating film on a whole surface of the substrate with an organic insulating material to cover the conductive pattern;
    preparing a printing plate coated with an insulating film removing material, and forming a contact hole by removing a first portion of the organic insulating film through making the insulating film removing material come in contact with the first portion of the organic insulating film that corresponds to the conductive pattern; and
    forming a contact in the contact hole.

2. The method as claimed in claim 1, wherein the conductive pattern is formed of a first conductive material.

3. The method as claimed in claim 1, wherein the organic insulating film is formed of at least one of polystyrene, polyvinylalcohol, polyvinylphenol, and polymethylmethacrylate using a coating or printing method.

4. The method as claimed in claim 1, wherein the insulating film removing material is a material having higher surface energy than the organic insulating film, or a solvent that dissolves the organic insulating film.

5. The method as claimed in claim 1, wherein:
    the printing plate includes a rotary body and a plurality of projections on an outer surface of the body, and the insulating film removing material is coated on the projections and is a material that has higher surface energy than the organic insulating film, and
    the forming the contact hole includes making the insulating film removing material come in contact with the first portion of the organic insulating film, making the insulating film removing material come in close contact with the first portion of the organic insulating film while rotating the body through application of pressure to the printing plate, and separating the first portion of the organic insulating film from the conductive pattern in a state where the first portion of the organic insulating film is in close contact with the insulating film removing material.

6. The method as claimed in claim 5, wherein the insulating film removing material is selected from an organic polymer, silicon oxide, and silicon nitride.

7. The method as claimed in claim 1, wherein:
    the printing plate includes a rotary body and a plurality of projections on an outer surface of the body, and the insulating film removing material is coated on the projections and is a solvent that dissolves the organic insulating film, and
    the forming of the contact hole includes dissolving the first portion of the organic insulating film by the insulating film removing material where the insulating film removing material comes in contact with the first portion of the organic insulating film.

8. The method as claimed in claim 7, wherein the insulating film removing material is selected from toluene, ethyl alcohol, and propylene glycol monomethyl ether acetate.

9. The method as claimed in claim 1, wherein:
    the printing plate includes a first printing plate having a first rotary body and a plurality of first projections on an outer surface of the first body, and a second printing plate having a second rotary body and a plurality of second projections on an outer surface of the second body,
    the insulating film removing material includes a first insulating film removing material coated on the first projections and having higher surface energy than the organic insulating film, and a second insulating film removing material coated on the second projections and dissolving the organic insulating film, and
    the forming of the contact hole includes dissolving the first portion of the organic insulating film by the second insulating film removing material through making the second insulating film removing material come in contact with the first portion of the organic insulating film, making the first insulating film removing material come in contact with a second portion of the organic insulating film where the second portion of the organic insulating film remains on the conductive pattern, making the first insulating film removing material come in close contact with the second portion of the organic insulating film while rotating the first body through application of pressure to the first printing plate, and separating the second portion of the organic insulating film from the conductive pattern in a state where the second portion of the organic insulating film is in close contact with the first insulating film removing material.

10. A method for fabricating an organic light emitting display device, the method comprising:
    forming an active layer on a substrate, the active layer including a channel region and a source region and a drain region on respective sides of the channel region;
    forming an organic gate insulating film on a whole surface of the substrate to cover the active layer, forming a gate electrode on a region, which corresponds to the channel region, of an upper portion of the organic gate insulating film, and forming an interlayer insulating film on a whole surface of the organic gate insulating film to cover the gate electrode;
    preparing a printing plate coated with an insulating film removing material, and forming a first contact hole and a second contact hole by removing each of a first portion and a second portion of an organic gate electrode and the interlayer insulating film corresponding to each of the source region and the drain region through making the insulating film removing material come in contact with each of the first portion and the second portion of the organic gate electrode and the interlayer insulating film; and
    forming a source electrode in the first contact hole and forming a drain electrode in the second contact hole.

11. The method as claimed in claim 10, wherein the channel region is a center region of the active layer that is formed of a semiconductor material, and the source region and the drain region are formed by injecting ions onto the semiconductor material.

12. The method as claimed in claim 10, wherein the channel region is formed of an organic semiconductor material using a coating or printing method, and the source region and the drain region are formed of an organic conductive material using the coating or printing method.

13. The method as claimed in claim 10, wherein the organic gate insulating film and the interlayer insulating film are formed of at least one of polystyrene, polyvinylalcohol, polyvinylphenol, and polymethylmethacrylate using a coating or printing method.

14. The method as claimed in claim 10, wherein the gate electrode is formed of an organic conductive material using a printing method.

15. The method as claimed in claim 10, wherein the insulating film removing material is a material having higher surface energy than each of the organic gate insulating film and the interlayer insulating film, or is a solvent that dissolves the organic gate insulating film and the interlayer insulating film.

16. The method as claimed in claim 10, wherein:
the printing plate includes a rotary body and a plurality of projections on an outer surface of the body, and the insulating film removing material is a material that is coated on the projections and has higher surface energy than each of the organic gate insulating film and the interlayer insulating film, and
the forming of the contact holes includes making the insulating film removing material come in contact with each of the first portion and the second portion of the organic gate electrode and the interlayer insulating film, making the insulating film removing material come in close contact with each of the first portion and the second portion of the organic gate electrode and the interlayer insulating film while rotating the body through application of pressure to the printing plate, and separating the first portion and the second portion of the organic gate electrode and the interlayer insulating film from the source region and the drain region in a state where each of the first portion and the second portion of the organic gate electrode and the interlayer insulating film is in close contact with the insulating film removing material.

17. The method as claimed in claim 16, wherein the insulating film removing material is selected from an organic polymer, silicon oxide, and silicon nitride.

18. The method as claimed in claim 10, wherein:
the printing plate includes a rotary body and a plurality of projections on an outer surface of the body, and the insulating film removing material is coated on the projections and is a solvent that dissolves the interlayer insulating film and the organic gate insulating film, and
the forming of the contact holes includes dissolving each of the first portion and the second portion of the organic gate electrode and the interlayer insulating film by the insulating film removing material where the insulating film removing material comes in contact with each of the first portion and the second portion of the organic gate electrode and the interlayer insulating film.

19. The method as claimed in claim 18, wherein the insulating film removing material is selected from toluene, ethyl alcohol, and propylene glycol monomethyl ether acetate.

20. The method as claimed in claim 10, wherein:
the printing plate includes a first printing plate having a first rotary body and a plurality of first projections on an outer surface of the first body, and a second printing plate having a second rotary body and a plurality of second projections on an outer surface of the second body,
the insulating film removing material includes a first insulating film removing material coated on the first projections and having higher surface energy than each of the interlayer insulating film and the organic gate insulating film, and a second insulating film removing material coated on the second projections and dissolving the interlayer insulating film and the organic gate insulating film, and
the forming of the contact holes includes dissolving each of the first portion and the second portion of the organic gate electrode and the interlayer insulating film by the second insulating film removing material through making the second insulating film removing material come in contact with each of the first portion and the second portion of the organic gate electrode and the interlayer insulating film, making the first insulating film removing material come in contact with each of a third portion and a fourth portion of the organic gate electrode and the interlayer insulating film where the third portion and the fourth portion of the organic gate electrode and the interlayer insulating film remain on each of the source region and the drain region, making the first insulating film removing material come in close contact with each of the third portion and the fourth portion of the organic gate electrode and the interlayer insulating film while rotating the first body through application of pressure to the first printing plate, and separating each of the third portion and the fourth portion of the organic gate electrode and the interlayer insulating film from each of the source region and the drain region in a state where each of the third portion and the fourth portion of the organic gate electrode and the interlayer insulating film are in close contact with the first insulating film removing material.

21. The method as claimed in claim 10, wherein the source electrode and the drain electrode are formed of an organic conductive material using an inkjet printing method.

* * * * *